(12) United States Patent
Sugimoto

(10) Patent No.: US 7,332,891 B2
(45) Date of Patent: Feb. 19, 2008

(54) ABNORMALITY DIAGNOSIS DEVICE AND METHOD FOR BATTERY PACK

(75) Inventor: Tomonaga Sugimoto, Fujisawa (JP)

(73) Assignee: Nissan Motor Co., Ltd., Kanagawa-Ken (JP)

( * ) Notice: Subject to any disclaimer, the term of this patent is extended or adjusted under 35 U.S.C. 154(b) by 510 days.

(21) Appl. No.: 10/463,536

(22) Filed: Jun. 18, 2003

(65) Prior Publication Data

US 2004/0001996 A1 Jan. 1, 2004

(30) Foreign Application Priority Data

Jun. 26, 2002 (JP) .............................. 2002-185807

(51) Int. Cl.
*H01M 10/46* (2006.01)
(52) U.S. Cl. ...................................... 320/116
(58) Field of Classification Search ................ 320/116, 320/117, 118, 132, 134, 136
See application file for complete search history.

(56) References Cited

U.S. PATENT DOCUMENTS 6,255,826 B1 * 7/2001 Ohsawa et al. ............. 320/116

FOREIGN PATENT DOCUMENTS

| JP | 2002-8733 | 1/2002 |
| JP | 2002-33135 | 1/2002 |

* cited by examiner

*Primary Examiner*—Edward H Tso
(74) *Attorney, Agent, or Firm*—McDermott Will & Emery LLP

(57) ABSTRACT

In a battery pack which includes a plurality of parallel blocks, each of which comprises a plurality of cells connected in parallel, and which are themselves connected in series, the voltage of each parallel block of the battery pack before and after discharge or before and after charge of a predetermined amount of capacity is detected, and abnormality of the cells connected in parallel within each parallel block is determined based upon the amount of change of voltage of each parallel block.

21 Claims, 6 Drawing Sheets

FIG. 6

| CELL OPEN CIRCUIT VOLTAGE Vo (VOLTS) | SOC (%) |
|---|---|
| 4.20 | 100 |
| 4.16 | 95 |
| ...... | ...... |
| 3.25 | 15 |
| 3.15 | 10 |
| 3.00 | 5 |

FIG. 7

| TOTAL VOLTAGE Vo' (VOLTS) | SOC (%) |
|---|---|
| 403.2 | 100 |
| 399.4 | 95 |
| ...... | ...... |
| 312.0 | 15 |
| 302.4 | 10 |
| 288.0 | 5 |

ABNORMALITY DIAGNOSIS DEVICE AND METHOD FOR BATTERY PACK

BACKGROUND OF THE INVENTION

1. Field of the Invention

The present invention relates to a device and a method for diagnosis of abnormality in a battery pack which comprises a plurality of cells which are connected in series-parallel.

2. Description of the Related Art

With relation to a battery pack in which a plurality of cells are connected in series, there is a per se known type of battery pack abnormality diagnosis device which detects whether any cell is in an abnormal state, based upon the measured value of the voltage of each cell (see Japanese Laid-Open Patent Publication No. 2002-033135).

However, with a battery pack in which a plurality of parallel blocks, each of which is made up from a plurality of cells connected in parallel, are themselves connected in series, it is not easy to measure the cell voltages by providing an individual voltage sensor to each of the cells connected in parallel within each of the parallel blocks, both from the point of view of cost and from that of technique. Accordingly, a method has been considered of measuring the voltage of each parallel block unit by providing one sensor to each such parallel block unit.

SUMMARY OF THE INVENTION

However, if simply the cell voltage of each parallel block unit is measured, it is difficult to detect cell abnormality reliably, since, even if cell voltage changes by occurring a reduction in the capacity of one of the cells which are connected in parallel within one block unit or an increase in its internal resistance, no great change of voltage occurs for the entire parallel block as a whole.

It would be desirable to provide a device and a method for diagnosis of abnormality in a battery pack which comprises a plurality of cells connected in a series-parallel configuration.

An abnormality diagnosis device for a battery pack according to this present invention comprising a plurality of parallel blocks, each of which comprises a plurality of cells connected in parallel, and which are themselves connected in series comprises a voltage detection device which detects voltages of each parallel block of the battery pack, and an abnormality determination device which performs a diagnosis of abnormality of the cells connected in parallel within each parallel block, based upon the amount of change of voltages of each parallel block during discharge or charge of the battery pack.

In an abnormality diagnosis method for a battery pack according to this present invention comprising a plurality of parallel blocks, each of which comprises a plurality of cells connected in parallel, and which are themselves connected in series, voltages of each parallel block of the battery pack during discharge or charge of the battery pack are detected and an abnormality of the cells connected in parallel within each parallel block is determined based upon the amount of change of voltages of each parallel block.

BRIEF DESCRIPTION OF THE DRAWINGS

FIG. 6 is a table of cell open circuit voltage Vo against SOC (state of charge).

FIG. 7 is a table of the total voltage of a battery pack against SOC.

DETAILED DESCRIPTION OF THE PREFERRED EMBODIMENTS

In the following, the preferred embodiments of the abnormality diagnosis device and method for a battery pack according to the present invention will be explained in terms of their application to an electric vehicle (an EV). In other words, the abnormality diagnosis device for a battery pack according to the present invention will perform abnormality diagnosis for a battery which is carried in an electric vehicle.

Figure 1:
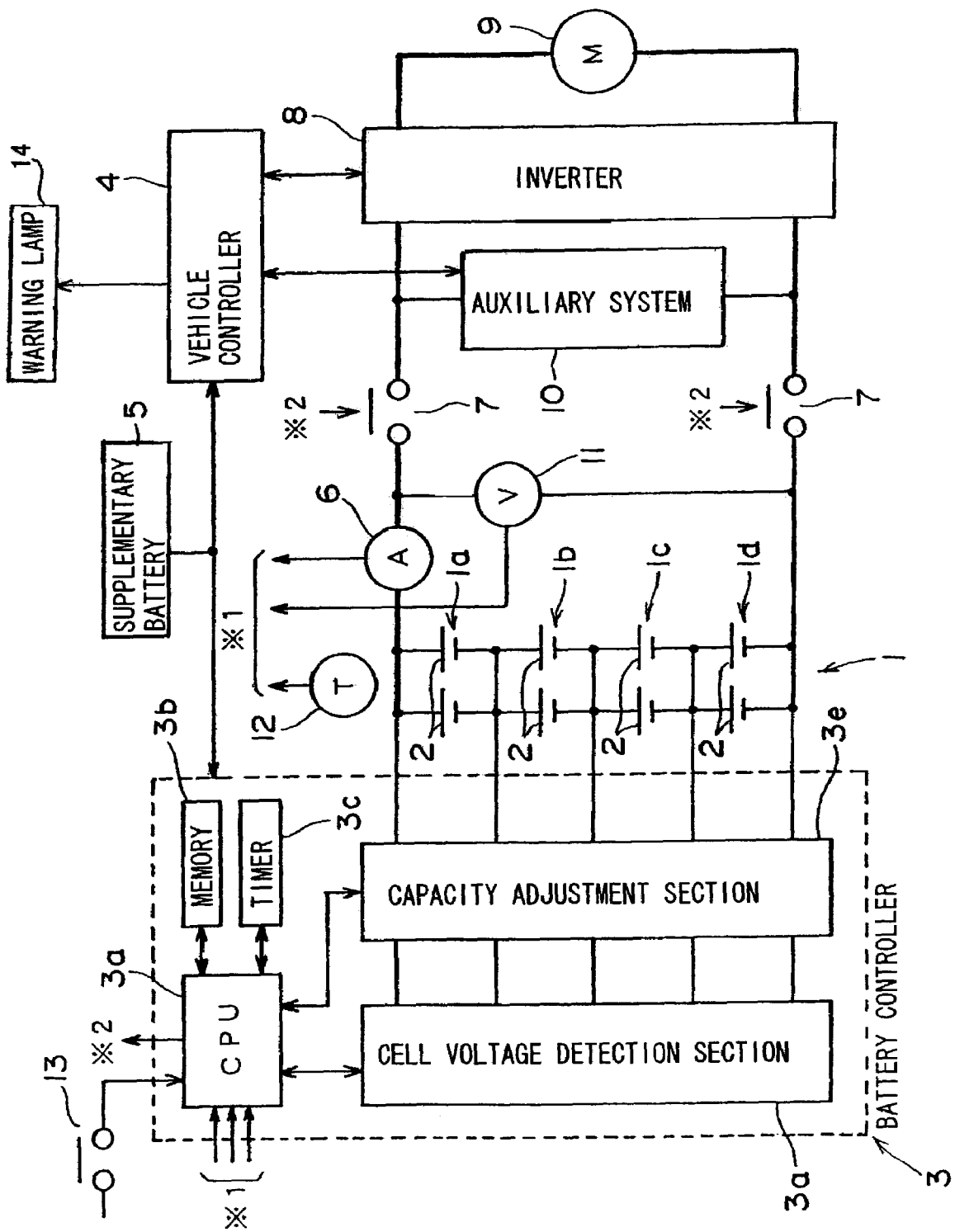
FIG. 1 shows the structure of the preferred embodiment of the abnormality diagnosis device for a battery pack of the present invention, as applied to an electric vehicle.

FIG. 1 is a figure showing the structure of this preferred embodiment of the abnormality diagnosis device for a battery pack according to the present invention, applied to an electrically propelled vehicle. A battery pack 1 comprises four parallel blocks 1a, 1b, 1c and 1d connected in series, each of which comprises two unit cells 2 connected in parallel. In this preferred embodiment, the battery pack 1 will be termed a main battery in order to distinguish it from a supplementary battery 5 which supplies electrical power to a battery controller 3 and a vehicle controller 4.

It is to be noted that although, in the explanation of this preferred embodiment, the case is discussed in which each parallel block consists of two cells connected in parallel, and four of these parallel blocks are connected in series to constitute the complete battery (battery pack 1), this is only by way of example; the number of the cells which are connected together in parallel in each parallel block, and the number of parallel blocks which are connected in series to constitute the complete battery, are not limited by this current case.

This main battery 1 is connected via a current sensor 6 and a main relay 7 to an inverter 8 and an auxiliary system 10, and supplies DC electrical power to the inverter 8 and auxiliary system 10. The inverter 8 converts this DC power from the main battery 1 into AC power and supplies it to an AC motor 9 for driving the vehicle. This electric vehicle is driven along the road by the drive force of the AC motor 9. The inverter 8 also converts regenerative AC power which is generated by the motor 9 during regenerative braking into DC power, and charges the main battery 1 therewith.

The battery controller 3 comprises a CPU 3a, a memory 3b, a timer 3c, a cell voltage detection section 3d, a capacity adjustment section 3e and the like, and, along with controlling charging and discharging and capacity adjustment of the main battery 1, also performs abnormality diagnosis for the cells 2. The cell voltage detection section 3d detects the average terminal voltages of the cells 2 which are connected in parallel in each of the parallel blocks 1a through 1d in the main battery 1. The capacity adjustment section 3e compensates for capacity deviations between the parallel blocks, based upon the average terminal voltages of each of the parallel blocks 1a through 1d which have been detected by the cell voltage detection section 3d. The details of this capacity adjustment section 3e will be explained hereinafter.

The vehicle controller 4 controls the running of the vehicle and the operation of its auxiliaries by controlling the inverter 8 and an auxiliary system 10. It is to be noted that an air conditioner system, a lighting system, wipers and the like are included in the auxiliary system 10.

The current sensor 6 detects the discharge current which flows from the battery 1 to the inverter 8, and the charging current which flows from the inverter 8 to the battery 1. The value of the current which is detected by the current sensor 6 is output to the CPU 3a. The main relay 7 performs connection and disconnection between the main battery 1 and its load (the motor 9 and the auxiliary system 10) according to commands from the CPU 3a.

A voltage sensor 11 detects the total voltage of the main battery 1. The value of the voltage of the main battery 1 which has detected is output to the CPU 3a. A temperature sensor 12 detects the temperature of the main battery 1. The value of the temperature of the main battery 1 which has detected is output to the CPU 3a. A main switch 13 corresponds to the ignition switch on a conventional ICE (internal combustion engine) powered automobile, and goes closed circuit (ON) when a main key (not shown) of this electric vehicle is set to a running position by the vehicle driver. A warning lamp 14 which is connected to the vehicle controller 4 notifies the driver of the occurrence of abnormality by being turned on when the controller 4 has detected that some abnormality in the operation of this electric vehicle has occurred.

Figure 2:
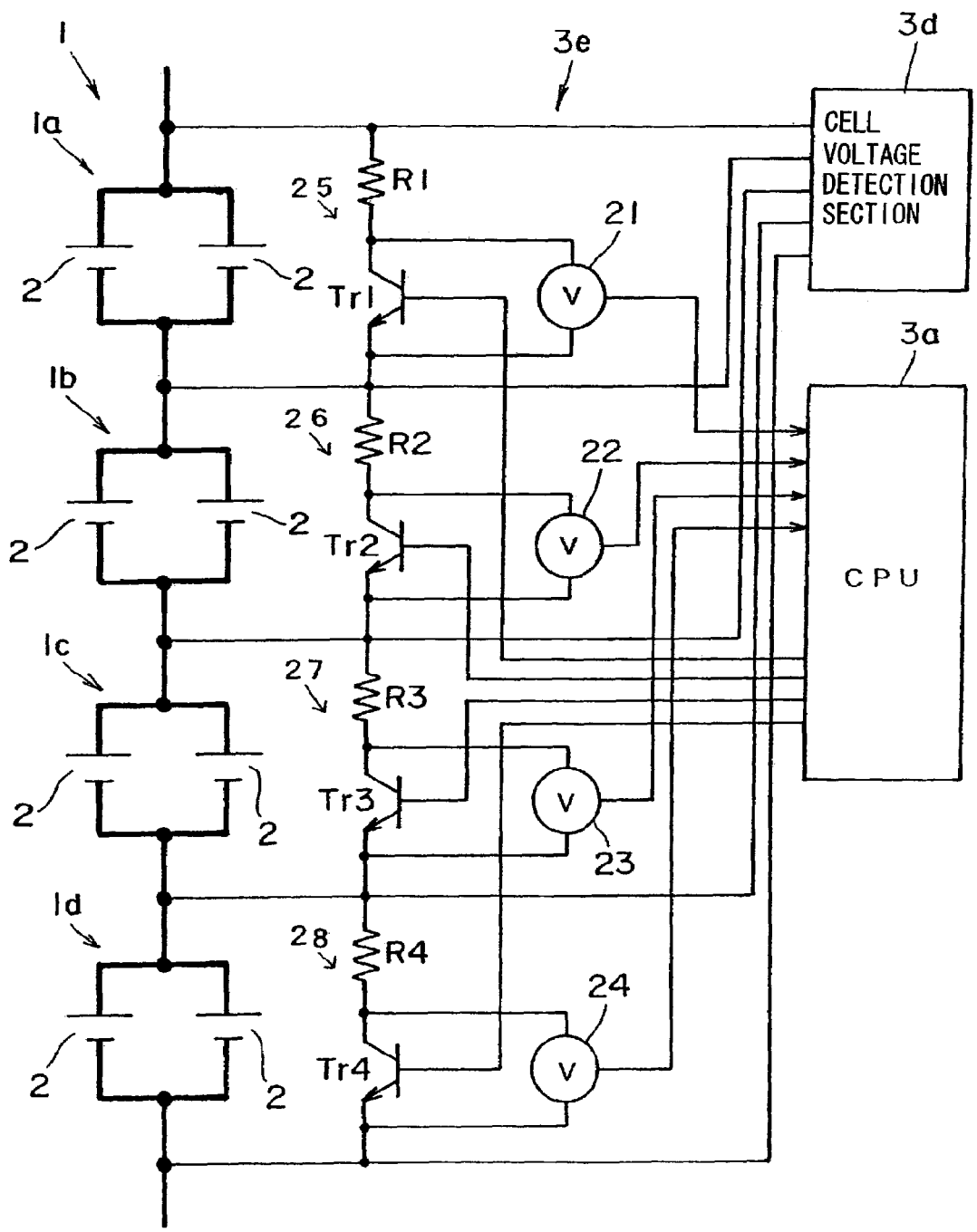
FIG. 2 shows the detailed structure of a capacity adjustment section of this device.

FIG. 2 is a figure showing the detailed structure of the capacity adjustment section 3e. A circuit 25 consisting of a resistor R1 and a bipolar transistor Tr1 connected in series is connected in parallel to the parallel block 1a in the main battery 1. Similarly, to each of the parallel blocks 1b~1d respectively, there is connected a circuit 26~28 consisting of a resistor R2~R4 and a bipolar transistor Tr2~Tr4 in series. The resistors R1 through R4 are discharge resistors, while the transistors Tr1 through Tr4 are switches for performing cell discharge and stopping of cell discharge. In other words, the series circuits 25 through 28 are circuits for adjusting the charge capacity (hereinafter referred to as State of Charge or SOC) of the cells 2 in each of the parallel blocks 1a through 1d.

The CPU 3a controls the turning ON (conductive) and OFF (non-conductive) of each of the transistors Tr1 through Tr4 which are respectively connected to the parallel blocks 1a through 1d by sending signals to the base terminals of the transistors Tr1 through Tr4. For example, since when the transistor Tr1 is turned ON, the power charged into the cells 2 in the parallel block 1a is discharged via the resistor R1, accordingly its SOC is reduced by the amount of this discharge. The CPU 3a performs duty ratio control in which each of the transistors Tr1 through Tr4 are turned ON and OFF repeatedly. This duty ratio control is performed based upon the charge capacity and the discharge time (capacity adjustment time) of each of the parallel blocks 1a through 1d.

Voltage sensors 21 through 24 are connected between the collector terminals and the emitter terminals of the transistors Tr1 through Tr4 respectively. When each of the transistors Tr1 through Tr4 is turned ON, the voltage between its collector terminal and its emitter terminal is 0V, while when it is turned off, the voltage between its collector terminal and its emitter terminal is equal to the voltage between the two terminals of the two cells 2 which make up its respective parallel block 1a through 1d. The CPU 3a monitors the voltage between the collector terminal and the emitter terminal of each of the transistors Tr1 through Tr4 which is detected by the respective one of the voltage sensors 21 through 24, and thereby checks the operational state of each of the transistors Tr1 through Tr4, in other words the capacity adjustment state of each of the parallel blocks 1a through 1d.

When the cells 2 in any one of the parallel blocks 1a through 1d get into the over-charged state or into the over-discharged state, there is a possibility that the capacity of the main battery 1 will not be able to be sufficiently utilized. Accordingly, the capacity adjustment section 3a performs capacity adjustment of each of the parallel block units 1a through 1d, and thereby prevents any of the parallel blocks from getting into the over-charged state or into the over-discharged state. However, the capacity adjustment section 3e cannot adjust for capacity deviations between the two cells which are connected in parallel in each of the parallel blocks 1a through 1d. In this case, such capacity deviations between the two cells which are connected in parallel in each of the parallel blocks 1a through 1d must be canceled by capacity self-adjustment, as will be described hereinafter.

Here, the manner in which the capacity self-adjustment is performed for each of the two cells which are connected in parallel in each of the parallel blocks 1a through 1d is explained simply. When such capacity deviation occurs between the two cells which are connected in parallel, the capacity of the cell whose capacity is higher, in other words the capacity of the cell whose terminal voltage is higher, gradually shifts to the cell whose capacity is lower, in other words to the cell whose terminal voltage is lower, so that there is a tendency for these two cells which are connected in parallel to finally arrive at the same capacity. This tendency is termed capacity self-adjustment. The speed of change of capacity until the equal capacity state is closely approached is the faster the greater is the capacity difference (the difference in the cell open circuit voltages), and slows down when the capacity difference becomes small so that the system is close to the equal capacity state.

Next, the method according to the present invention will be explained of determining abnormality of a plurality of cells connected in parallel, for a battery pack in which a plurality of parallel blocks, each of which is made up from a plurality of cells connected in parallel, are themselves connected in series. When the main battery 1 is in no load state, the no load voltage $V_n$ (where n=1, 2, 3, 4) of each of the parallel blocks 1a through 1d is measured. The no load state for the main battery 1 occurs, for example, when the main relay 7 is open circuit, or when the charge or discharge current of the main battery 1 is 0A or nearly 0A although the main relay 7 is closed circuit.

Furthermore, the voltage $V_n'$ of each of the parallel blocks 1a through 1d is measured after discharge or charge of a predetermined amount of capacity $\Delta Ah$. Discharge of a predetermined amount of capacity $\Delta Ah$ may be performed by forcibly operating the air conditioner device constituting the auxiliary system 10, or by operating the motor 9.

Next, the average voltage $V_{ave}$ of all of the parallel blocks 1a through 1d during the no load condition, and the average voltage $V_{ave}'$ of all of the parallel blocks 1a through 1d after discharge or charge of a predetermined amount of capacity ΔAh, are calculated respectively according to the following Equations (1):

$$Vave = \Sigma Vi/n$$

$$Vave' = \Sigma Vi'/n \quad (1)$$

In Equations (1), Σ represents the total sum over i=1~n, and in this preferred embodiment, ΣVi=V1+V2+V3+V4. In this preferred embodiment of the present invention, when the main battery 1 is discharged or is charged from the no load state by the predetermined amount of capacity ΔAh, the amount of change of voltage (Vn-Vn') of each of the parallel blocks 1a through 1d and the amount of change of average voltage (Vave-Vave') are compared together, and if the difference between them is large, it is determined that an abnormality is present with one or the other of the cells which are connected in parallel in the corresponding one of the parallel blocks 1a through 1d.

In concrete terms, abnormality diagnosis of the cells which are connected in parallel in each parallel block unit is performed based upon the following determination Equation (2):

$$\{(Vn-Vn')-(Vave-Vave')\}/\Delta Ah \geq Vng \cdot \alpha \cdot \beta \quad (2)$$

In Equation (2), Vng is a threshold for determining that an abnormality is present in cells connected in parallel. This abnormality determination threshold Vng is set according to the type of the battery pack, the number of cells which are connected in parallel in each of the parallel blocks 1a through 1d, the range of SOC and the like, and is stored in advance in the memory 3b. By thus setting the abnormality determination threshold Vng, it is possible accurately to determine the abnormality in the cells which are connected in parallel in each of the parallel blocks 1a through 1d.

Figure 3:
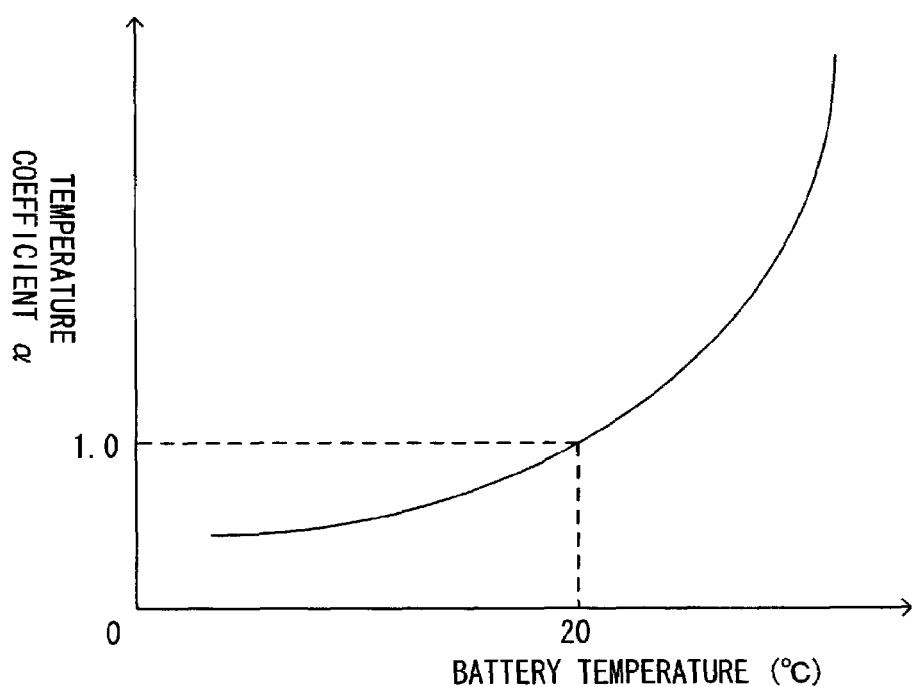
FIG. 3 is a graph of a temperature coefficient α against battery temperature.

With the abnormality diagnosis device for a battery pack in the preferred embodiment, this determination threshold Vng is corrected according to the temperature of the main battery 1 and according to its degree of deterioration. The value α in Equation (2) is a temperature coefficient, and α=1 when the temperature of the battery 1 is 20° C. As shown in FIG. 3, this temperature coefficient α increases, the higher is the temperature of the battery 1. It is to be noted that the table of the temperature coefficient α against battery temperature as shown in FIG. 3 is stored in advance in the memory 3b.

Figure 4:
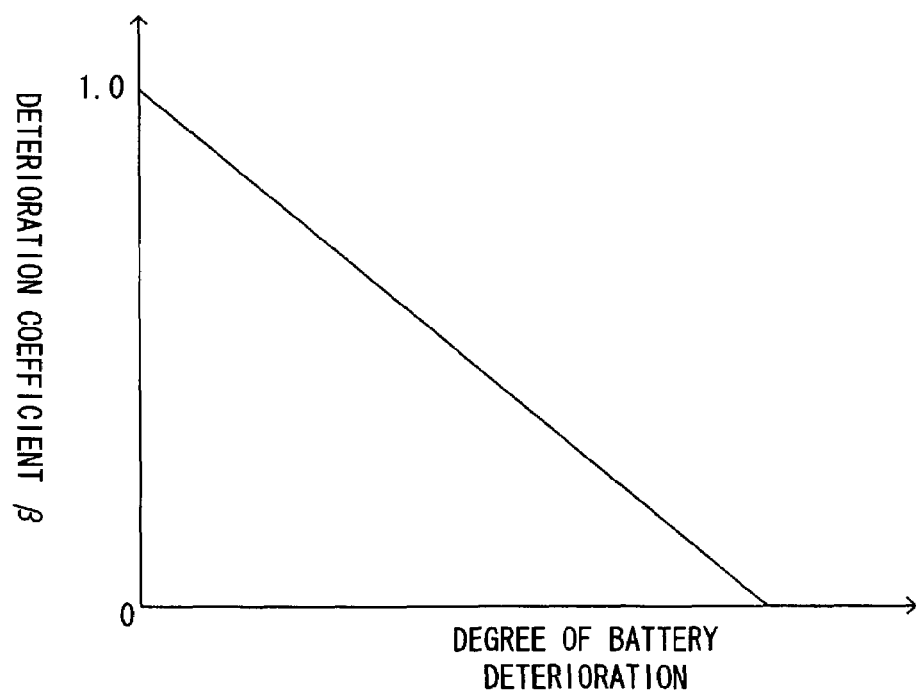
FIG. 4 is a graph of a deterioration coefficient β against degree of battery deterioration.

Moreover, β in Equation (2) is a deterioration coefficient which gives the degree of deterioration of the main battery 1, and β=1.0 when the battery 1 is new. As shown in FIG. 4, this deterioration coefficient β diminishes, the greater is the degree of deterioration of the battery 1. It is to be noted that the table of the deterioration coefficient β against the degree of deterioration of the battery 1 as shown in FIG. 4 is stored in advance in the memory 3b.

By adjusting the abnormality determination threshold Vng for performing abnormality diagnosis of cells connected in parallel according to the temperature and the degree of deterioration of the main battery 1 in this manner, it is possible accurately to determine abnormality of the cells which are connected in parallel in each of the parallel blocks 1a through 1d, even if the state of the battery 1 changes.

It is to be noted that, although various methods have been proposed for detecting the degree of deterioration of a battery, the degree of deterioration is detected by the following method with the abnormality diagnosis device for a battery pack in this preferred embodiment of the present invention. First, the terminal voltage of the battery and the charge current or discharge current are measured, and the regression line of the voltage—current characteristic of the battery is obtained based upon the results of these measurements. Then, the internal resistance of the battery is inferred from the slope of this regression line, and the degree of deterioration of the battery is obtained based upon this inferred internal resistance value and the initial value of battery internal resistance. In this preferred embodiment, detection of the degree of deterioration of the main battery 1 is repeatedly performed as opportunity offers, and each fresh result is stored in the memory 3b.

Figure 5:
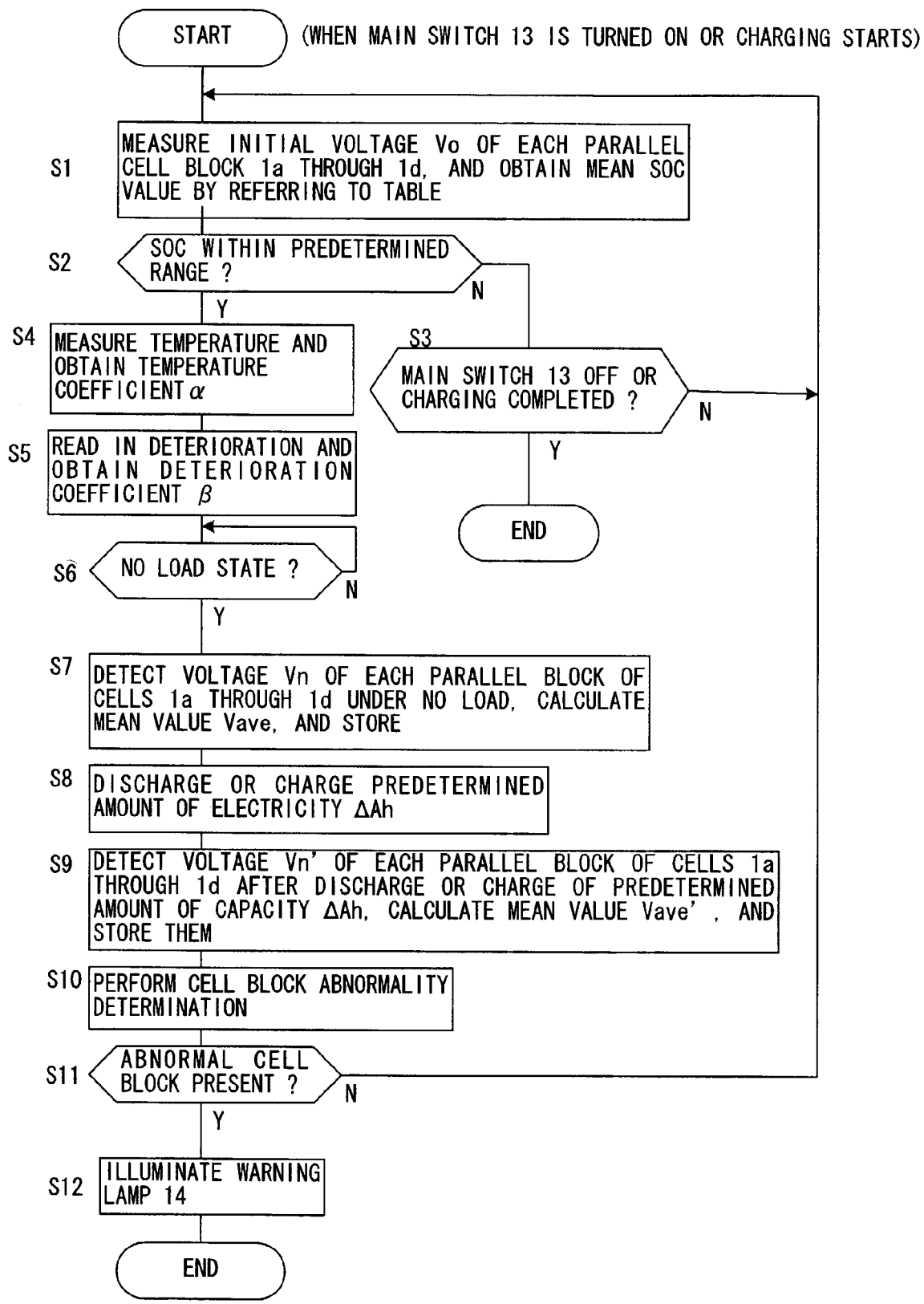
FIG. 5 is a flowchart showing the procedural flow of a cell abnormality diagnosis program of the preferred embodiment of the present invention.

FIG. 5 is a flowchart showing the procedural flow of a cell abnormality diagnosis program of this preferred embodiment. The CPU 3a in the battery controller 3 commences the execution of this cell abnormality diagnosis program when the main switch 13 is turned ON to start up the electric vehicle, or when charging of the main battery 1 is started by a charging device (not shown in the figures).

In the first step S1, during the time period from when the main switch 13 is turned ON to when the main relay 7 goes ON (closed circuit), in other words while the main battery 1 is in the open circuit state, the cell open circuit voltage Vo of each of the parallel blocks 1a through 1d is measured by the cell voltage detection section 3d. Then, the average value of this cell open circuit voltage Vo of all of the parallel blocks 1a through 1d is calculated, and, based upon a data table of cell open circuit voltage against battery SOC (refer to FIG. 6) which is stored in the memory 3b, the SOC [%] which corresponds to the average value of the open circuit voltage Vo [V] is obtained by interpolation calculation.

It is to be noted that it would also be acceptable to detect the total voltage Vo' of the main battery 1, and to obtain the SOC which corresponds to this measured total voltage Vo' of the battery 1 based upon a table of total voltage against battery SOC (refer to FIG. 7) by interpolation calculation. The total voltage Vo' may be obtained by adding together the cell open circuit voltages of each of the parallel cell blocks 1a through 1d which have been detected by the cell voltage detection section 3d; or it may also be detected by the voltage sensor 11.

In the next step S2, a decision is made as to whether or not the SOC of the main battery 1 is within a predetermined range. The predetermined range is a range in which the slope |ΔVo/ΔSOC| (or |ΔVo/ΔAh|) of the characteristic curve of the cell open circuit voltage Vo with respect to the SOC of the main battery 1 is greater than a predetermined value. This predetermined range is stored in advance in the memory 3b.

Figure 8:
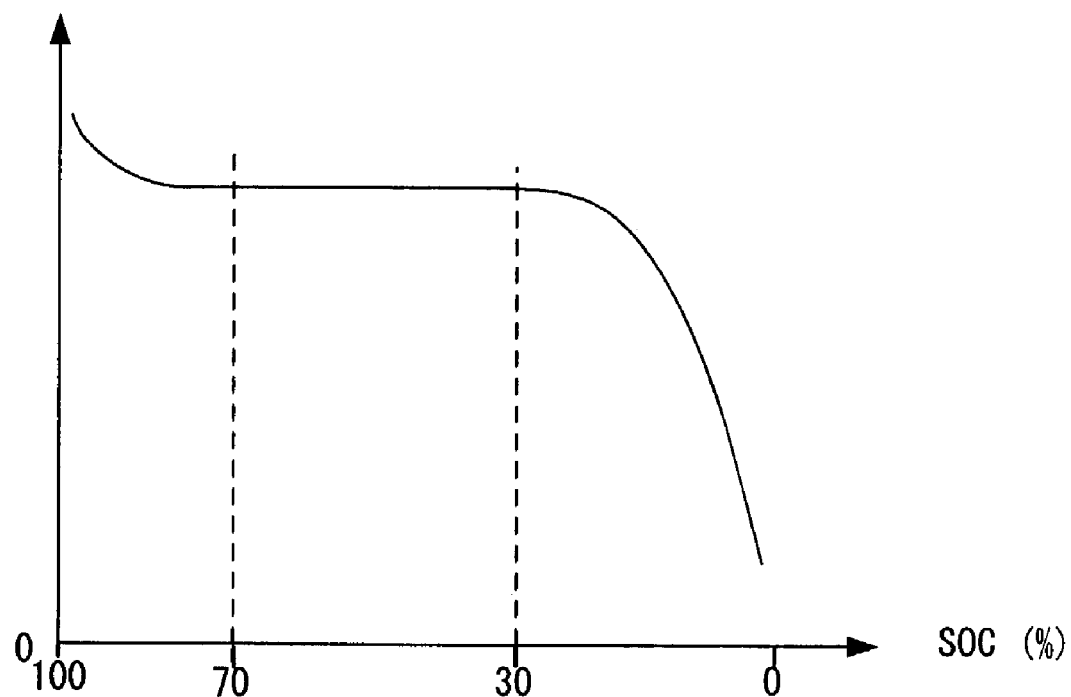
FIG. 8 is a graph of open circuit voltage against SOC for a lithium ion battery.

FIG. 8 is a graph of open circuit voltage Vo [V] against SOC [%] for a lithium ion battery. As shown in FIG. 8, in the range of SOC below about 30% and above about 70%, the slope |ΔVo/ΔSOC| of the characteristic curve of the cell open circuit voltage Vo with respect to SOC is relatively large, while, in the range of SOC between about 30% and about 70%, the slope |ΔVo/ΔSOC| of the characteristic curve of the cell open circuit voltage Vo with respect to SOC is relatively small.

When the slope |ΔVo/ΔSOC| of the characteristic curve of the cell open circuit voltage Vo with respect to SOC is relatively small, it is difficult to diagnose cell abnormality correctly for a following reason. Namely, since the amount of change of voltage (Vn-Vn') is small in a range where |ΔVo/ΔSOC| is small, it is easy for an error to occur in the cell abnormality diagnosis performed based upon the above Equation (2).

Thus, in this preferred embodiment of the present invention, according to the decision in the step S2, cell abnormality diagnosis is performed if the SOC of the main battery 1 is in a range in which the slope $|\Delta Vo/\Delta SOC|$ (or $|\Delta Vo/\Delta Ah|$) of the characteristic curve of the cell open circuit voltage Vo with respect to the SOC of the main battery 1 is greater than a predetermined value. If in this step S2 it is determined that the SOC of the main battery 1 is not within the predetermined range, then the flow of control proceeds to the next step S3 and a decision is made as to whether or not the main switch 13 is OFF or whether charging of the main battery 1 has been completed. If in this step S3 it is determined that the main switch 13 is OFF or that the charging of the main battery 1 has been completed, then the cell abnormality diagnosis is terminated, while in any other case the flow of control returns to the step S1, and the above described process is repeated.

On the other hand, if the SOC of the main battery 1 is within the predetermined range, then the flow of control continues to the step S4. In the step S4, the temperature coefficient a with respect to the measured temperature is obtained, based upon the temperature of the main battery 1 which has been measured by the temperature sensor 12 and upon the table of the temperature coefficient a against battery temperature which is stored in the memory 3b. When this temperature coefficient a has been obtained, the flow of control proceeds to the next step S5.

In the step S5, the most recently obtained degree of deterioration of the main battery 1 is read out from the memory 3b, and the deterioration coefficient β is obtained by referring to the table of deterioration coefficient β against the degree of battery deterioration which is stored in the memory 3b. When this deterioration coefficient β has been obtained, the flow of control proceeds to the next step S6.

In the step S6, a check is made as to whether or not the main battery 1 is in the no load state. If the charge/discharge current of the main battery 1 as detected by the current sensor 6 is zero or nearly zero, then it is determined that the main battery 1 is in the no load state and the flow of control proceeds to the step S7. On the other hand, if it is determined that the main battery 1 is not in the no load state, then the flow of control loops back to the step S6, to wait until the main battery 1 is in the no load state.

In the step S7, along with detecting the no load voltage Vn of each of the parallel blocks 1a through 1d by the voltage detection section 3d, the average no load voltage Vave is calculated based upon the above Equation (1). These detected no load voltages Vn and the average no load voltage Vave which has been calculated are stored in the memory 3b.

It is to be noted that, when performing a diagnosis of abnormality of cells 2 connected in parallel in the blocks 1a through 1d based upon the amount of change of voltage of these parallel blocks 1a through 1d before and after discharging or charging a predetermined amount of capacity in the main battery 1, it is possible, by performing discharging or charging of a predetermined amount of capacity from the no load state in which the battery 1 is in a stable state, to detect an accurate amount of change of voltage for each parallel block, so that, by doing this, it is possible to perform abnormality determination of cells 2 connected in parallel accurately.

In the step S8 which follows the step S7, discharging or charging of the main battery 1 with a predetermined amount of capacity ΔAh is performed. For example, the air conditioner or the like constituting the auxiliary system 10 may be forcibly operated, and, along with monitoring the discharge current by the current sensor 6, the time of discharge may be measured with the timer 3c to integrate the amount of discharge. Alternatively, charging of the main battery 1 may be started by utilizing a charging device (not shown in the figures), and, along with monitoring the charge current by the current sensor 6, the time of charge may be measured with the timer 3c to integrate the amount of charge. When the integrated value of the amount of discharge or the amount of charge arrives at a predetermined amount of capacity ΔAh which is determined in advance, the flow of control proceeds to the step S9.

In the step S9, the voltages Vn' of each of the parallel blocks 1a through 1d after the discharge or charge of the predetermined amount of capacity ΔAh are detected by the voltage detection section 3d, and their average voltage Vave' is calculated based upon the above Equation (1). These detected voltages Vn' and the calculated average voltage Vave' are stored in the memory 3b, and then the flow of control proceeds to the next step S10.

In the step S10, an abnormality determination is made for the cells 2 which are connected in parallel in each of the parallel blocks 1a through 1d, based upon Equation (2). When this abnormality determination has been made for all of the parallel blocks 1a through 1d, then the flow of control proceeds to the next step S11. In this step S11, based upon the results of the abnormality determination in the step S10, a decision is made as to whether or not any of these parallel cell blocks 1a through 1d has been deemed to be abnormal by satisfying the relation as defined in Equation (2). If any abnormal cell blocks are present, then the flow of control proceeds to the next step S12. In this step S12, the warning lamp is illuminated in order to provide a warning to the driver of the vehicle, and then this procedure terminates. On the other hand, if it is determined in the step S11 that no abnormal cell block is present, then the flow of control is returned to the step S1, and the above described procedure is repeated.

In this manner, for a battery pack in which a plurality of parallel blocks, each of which is made up from a plurality of cells connected in parallel, are themselves connected in series, the voltage of each parallel block before and after discharge or charge of a predetermined amount of capacity into or out of the battery pack is detected, and abnormality of the cells connected in parallel within each parallel block is determined based upon the amount of change of voltage of each parallel block. In other words, the average value of the amount of change of voltage of all the parallel blocks is obtained before and after discharge or charge of a predetermined amount of capacity into or out of the battery pack, and, if the deviation from the average value of the amount of change of voltage of any one of the parallel blocks is greater than the abnormality determination threshold, then it is determined that that parallel block includes one cell which is abnormal. By doing this, for a battery pack comprising a plurality of parallel blocks, each of which comprises a plurality of cells connected in parallel, and which are themselves connected in series, it is possible reliably to perform diagnosis of abnormality for cells connected in parallel.

The above described embodiment is an example, and various modifications can be made without departing from the spirit and scope of the invention. For example, in the above description of the preferred embodiment of the present invention, this abnormality diagnosis device diagnosed a battery pack which was mounted on an electric vehicle. However it would also be possible to perform abnormality diagnosis of a battery which is fitted to a hybrid vehicle or to an ICE vehicle, or of a battery which is utilized for any of many types of device other than a vehicle, using the abnormality diagnosis device for a battery pack according to the present invention.

Moreover, although in the disclosed preferred embodiment of the present invention, Equation (2) was utilized for determining abnormality of the cells which were connected in parallel within each parallel block, the equation which is utilized in this manner is not limited merely to being Equation (2). Furthermore although, in the above described preferred embodiment of the present invention, abnormality diagnosis was performed by initially discharging or charging a predetermined amount of capacity from or into the battery pack from the no load state, it would also be possible to perform abnormality diagnosis based upon the amount of change of voltage of a parallel block before and after discharging or charging a predetermined amount of capacity from or into the battery pack in a loaded state. However in this case, the accuracy of abnormality determination is less, as compared with a method in which such discharging or charging from or into the battery pack is performed in the no load state.

Yet further although, in the shown preferred embodiment of the present invention, the bipolar transistors Tr1 through Tr4 were utilized as the switches for the discharge circuits 25 through 28, it would also be possible to utilize semiconductor switching elements such as FETs, or to use relays or the like.

The disclosure of the following priority application is herein incorporated by reference: Japanese Patent Application No. 2002-185807, filed Jun. 26, 2002.

What is claimed is:

1. An abnormality diagnosis device for a battery pack comprising a plurality of parallel blocks, each of which comprises a plurality of cells connected in parallel, and which are themselves connected in series, comprising:
   a voltage detection device which detects a voltage of each parallel block of the battery pack; and
   an abnormality determination device which performs a diagnosis of abnormality of the cells connected in parallel within each parallel block, based upon an amount of change of the voltage of each parallel block before and after discharge or before and after charge, of the battery pack, wherein
   the abnormality determination device obtains the amount of change of the voltage of each parallel block before and after discharge or before and after charge, of the battery pack, and determines that an abnormal cell is included in the parallel block if the amount of charge of the voltage of the parallel block is greater than a predetermined value.

2. An abnormality diagnosis device for a battery pack according to claim 1, wherein:
   the abnormality determination device performs a diagnosis of abnormality of the cells connected in parallel within each parallel block, based upon the amount of change of the voltage of each parallel block before and after performing discharge of a predetermined amount of capacity from the battery pack.

3. An abnormality diagnosis device for a battery pack according to claim 1, wherein:
   the abnormality determination device performs a diagnosis of abnormality of the cells connected in parallel within each parallel block, based upon the amount of change of the voltage of each parallel block before and after performing charge of a predetermined amount of capacity into the battery pack.

4. An abnormality diagnosis device for a battery pack according to claim 1, wherein:
   the abnormality determination device obtains an average value of the amounts of change of the voltage for all of the parallel blocks before and after discharge or before and after charge of the battery pack, and determines that an abnormal cell is included in a parallel block, if the difference between the amount of change of the voltage of that parallel block and the average value of the amounts of change of the voltage for all of the parallel blocks is greater than the predetermined value.

5. An abnormality diagnosis device for a battery pack according to claim 4, wherein:
   the predetermined value is set according to the number of cells which are connected in parallel in each parallel block of the battery pack.

6. An abnormality diagnosis device for a battery pack according to claim 1, further comprising:
   an SOC detection device which detects the SOC of the battery pack, wherein:
   the abnormality determination device performs a diagnosis of abnormality of the cells connected in parallel within each parallel block when the SOC of the battery pack which is detected by the SOC detection device is in a range in which a slope $|\Delta Vo/\Delta SOC|$ of a characteristic curve of a cell open circuit voltage Vo with respect to the SOC of the battery pack is greater than a predetermined value of said slope.

7. An abnormality diagnosis device for a battery pack according to claim 6, wherein:
   the predetermined value of said slope is set according to a range of SOC of the battery pack.

8. An abnormality diagnosis device for a battery pack according to claim 1, wherein:
   when detecting the amount of change of the voltage of each parallel block, the state of the battery pack before discharge or charge is no load state.

9. An abnormality diagnosis device for a battery pack according to claim 4, further comprising:
   a temperature detection device which detects the temperature of the battery pack, wherein:
   the predetermined value is set according to the temperature of the battery pack which has been detected by the temperature detection device.

10. An abnormality diagnosis device for a battery pack according to claim 4, further comprising:
    a deterioration detection device which detects deterioration of the battery pack, wherein:
    the predetermined value is set according to the degree of deterioration of the battery pack which has been detected by the deterioration detection device.

11. An abnormality diagnosis device for a battery pack comprising a plurality of parallel blocks, each of which comprises a plurality of cells connected in parallel, and which are themselves connected in series, comprising:
    a voltage detection means for detecting a voltage of each parallel block of the battery pack; and
    an abnormality determination means for performing a diagnosis of abnormality of the cells connected in parallel within each parallel block, based upon an amount of change of the voltage of each parallel block before and after discharge or before and after charge, of the battery pack, wherein the abnormality determination means obtains the amount of change of the voltage of each parallel block before and after discharge or before and after charge, of the battery pack, and determines that an abnormal cell is included in the parallel block if the amount of change of the voltage of the parallel block is greater than a predetermined value.

12. An abnormality diagnosis method for a battery pack comprising a plurality of parallel blocks, each of which comprises a plurality of cells connected in parallel, and which are themselves connected in series, comprising:
   detecting a voltage of each parallel block of the battery pack before and after discharge or before and after charged of the battery pack; and
   performing a diagnosis of an abnormality of the cells connected in parallel within each parallel block based upon an amount of change of the voltage of each parallel block, wherein
   the amount of change of the voltage of each parallel block is obtained before and after discharge or before and after charge, of the battery pack, and it is determined that an abnormal cell is included in the parallel block if the amount of change of the voltage of the parallel block is greater than a predetermined value.

13. An abnormality diagnosis method for a battery pack according to claim 12, wherein:
   the amount of change of the voltage of each parallel block is an amount of change of the voltage of each parallel block before and after discharge of a predetermined amount of capacity from the battery pack.

14. An abnormality diagnosis method for a battery pack according to claim 12, wherein:
   the amount of change of the voltage of each parallel block is an amount of change of the voltage of each parallel block before and after charge of a predetermined amount of capacity into the battery pack.

15. An abnormality diagnosis method for a battery pack according to claim 12, wherein:
   the average value of the amounts of change of the voltage for all of the parallel blocks before and after discharge or before and after charge of the battery pack is obtained, and it is determined that an abnormal cell is included in a parallel block, if the difference between the amount of change of the voltage of that parallel block and the average value of the amounts of change of the voltage for all of the parallel blocks is greater than the predetermined value.

16. An abnormality diagnosis method for a battery pack according to claim 15, wherein:
   the predetermined value is set according to the number of cells which are connected in parallel in each parallel block of the battery pack.

17. An abnormality diagnosis method for a battery pack according to claim 12, further comprising:
   detecting the SOC of the battery pack, wherein:
   abnormality of the cells connected in parallel within each parallel block is performed, if the SOC of the battery pack is in a range in which a slope $|\Delta Vo\Delta/SOC|$ of a characteristic curve of a cell open circuit voltage Vo with respect to the SOC of the battery pack is greater than a predetermined value of said slope.

18. An abnormality diagnosis method for a battery pack according to claim 17, wherein:
   the predetermined value of said slope is set according to a range of SOC of the battery pack.

19. An abnormality diagnosis method for a battery pack according to claim 12, wherein:
   when detecting the amount of change of the voltage, the state of the battery pack before discharge or charge is no load state.

20. An abnormality diagnosis method for a battery pack according to claim 15, further comprising:
   detecting the temperature of the battery pack, wherein:
   the predetermined value is set according to the temperature of the battery pack which has been detected.

21. An abnormality diagnosis method for a battery pack according to claim 15, further comprising:
   detecting deterioration of the battery pack, wherein:
   the predetermined value is set according to the degree of deterioration of the battery pack which has been detected.

* * * * *